United States Patent
Rocklein et al.

(10) Patent No.: US 11,289,487 B2
(45) Date of Patent: Mar. 29, 2022

(54) DOPED TITANIUM NITRIDE MATERIALS FOR DRAM CAPACITORS, AND RELATED SEMICONDUCTOR DEVICES, SYSTEMS, AND METHODS

(71) Applicant: Micron Technology, Inc., Boise, ID (US)

(72) Inventors: Matthew N. Rocklein, Boise, ID (US); Paul A. Paduano, Nampa, ID (US); Sanket S. Kelkar, Boise, ID (US); Christopher W. Petz, Boise, ID (US); Zhe Song, Boise, ID (US); Vassil Antonov, Boise, ID (US); Qian Tao, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/903,964

(22) Filed: Feb. 23, 2018

(65) Prior Publication Data

US 2019/0267383 A1 Aug. 29, 2019

(51) Int. Cl.
*H01L 27/108* (2006.01)
*H01L 21/285* (2006.01)
*H01L 49/02* (2006.01)

(52) U.S. Cl.
CPC .. *H01L 27/10808* (2013.01); *H01L 21/28556* (2013.01); *H01L 27/10852* (2013.01); *H01L 28/90* (2013.01)

(58) Field of Classification Search
CPC .......................... H01L 27/10808; H01L 28/90
See application file for complete search history.

(56) References Cited

U.S. PATENT DOCUMENTS

| | | | |
|---|---|---|---|
| 5,696,017 A * | 12/1997 | Ueno | H01L 28/40 438/253 |
| 6,294,807 B1 * | 9/2001 | Chittipeddi | H01L 21/3144 257/310 |
| 6,720,027 B2 | 4/2004 | Yang et al. | |
| 6,753,618 B2 | 6/2004 | Basceri et al. | |
| 6,919,273 B1 | 7/2005 | Otsuki et al. | |
| 6,933,021 B2 | 8/2005 | Chou et al. | |

(Continued)

FOREIGN PATENT DOCUMENTS

| | | |
|---|---|---|
| EP | 1482551 B1 | 2/2007 |
| JP | 2015193878 A | 11/2015 |

(Continued)

OTHER PUBLICATIONS

Jun et al., Development of TiSiN CVD process using TiCl4/SiH4/NH3 chemistry for ULSI anti-oxidation barrier applications, Science and Technology of Advanced Materials, vol. 5, (2004), pp. 549-554.

(Continued)

*Primary Examiner* — Sarah K Salerno
(74) *Attorney, Agent, or Firm* — TraskBritt

(57) ABSTRACT

A DRAM capacitor comprising a first capacitor electrode configured as a container and comprising a doped titanium nitride material, a capacitor dielectric on the first capacitor electrode, and a second capacitor electrode on the capacitor dielectric. Methods of forming the DRAM capacitor are also disclosed, as are semiconductor devices and systems comprising such DRAM capacitors.

26 Claims, 8 Drawing Sheets

(56) References Cited

U.S. PATENT DOCUMENTS

| | | | |
|---|---|---|---|
| 7,041,335 B2 | 5/2006 | Chung | |
| 7,052,957 B2 | 5/2006 | Zheng | |
| 7,067,385 B2 | 6/2006 | Manning | |
| 7,195,973 B2 * | 3/2007 | Seidl | H01L 27/10867 257/301 |
| 7,781,818 B2 | 8/2010 | Manning et al. | |
| 7,812,452 B2 * | 10/2010 | Abe | H01L 27/11507 257/295 |
| 8,058,126 B2 | 11/2011 | Busch et al. | |
| 8,357,583 B2 | 1/2013 | Hirota et al. | |
| 9,553,141 B2 | 1/2017 | Yang et al. | |
| 9,812,329 B2 | 11/2017 | Chung et al. | |
| 2001/0054730 A1 * | 12/2001 | Kim | H01L 28/91 257/301 |
| 2003/0011012 A1 * | 1/2003 | Rhodes | H01L 28/75 257/303 |
| 2003/0168750 A1 * | 9/2003 | Basceri | H01L 28/75 257/532 |
| 2003/0205729 A1 | 11/2003 | Basceri et al. | |
| 2004/0009336 A1 | 1/2004 | Marcadal et al. | |
| 2004/0095896 A1 * | 5/2004 | Chudzik | H01L 27/10817 370/254 |
| 2004/0232467 A1 | 11/2004 | Otsuki et al. | |
| 2005/0003611 A1 | 1/2005 | Zheng | |
| 2005/0093052 A1 | 5/2005 | Agarwal et al. | |
| 2006/0018078 A1 * | 1/2006 | Fujimoto | H01G 9/04 361/271 |
| 2008/0029912 A1 | 2/2008 | Jeon | |
| 2008/0116437 A1 * | 5/2008 | Oh | H01L 45/144 257/2 |
| 2008/0121963 A1 * | 5/2008 | Govindarajan | H01L 29/513 257/310 |
| 2009/0021888 A1 | 1/2009 | Jung | |
| 2010/0155897 A1 * | 6/2010 | Collins | H01L 29/93 257/600 |
| 2011/0128667 A1 * | 6/2011 | Do | C23C 16/34 361/305 |
| 2013/0029470 A1 | 1/2013 | Hataya et al. | |
| 2013/0175666 A1 | 7/2013 | Tran et al. | |
| 2014/0054745 A1 | 2/2014 | Song et al. | |
| 2015/0054127 A1 | 2/2015 | Greeley et al. | |
| 2016/0197136 A1 | 7/2016 | Oh et al. | |

FOREIGN PATENT DOCUMENTS

| | | |
|---|---|---|
| KR | 100778866 B1 | 11/2007 |
| KR | 102011008398 A | 1/2011 |
| KR | 101189642 B1 | 10/2012 |
| KR | 1020130125079 | 11/2013 |
| KR | 10-2014-0065186 A1 | 5/2014 |

OTHER PUBLICATIONS

Nahar et al., Stress Modulation of Titanium Nitride Thin Films Deposited Using Atomic Layer Deposition, J. Vac. Sci. Technol. vol. A 35, No. 1, (Jan./Feb. 2017), pp. 01B144-1-01B144-9.

Taiwanese Office Action for Application No. 108105526, dated May 7, 2020, 14 pages.

Taiwanese Office Action for Application No. 10810556, dated Dec. 28, 2020, 14 pages.

International Written Opinion from International Application No. PCT/US2019/016254, dated May 17, 2019, 8 pages.

International Search Report from International Application No. PCT/US2019/016254, dated May 17, 2019, 4 pages.

Korean First Notice of Reasons for Rejection for Application No. 10-2020-7027476, dispatched Sep. 30, 2021, 11 pages.

Supplementary European Search Report for Application No. EP 19 75 6989, dated Oct. 6, 2021, 8 pages.

* cited by examiner

Container Displacement (a.u.) = 3

*Container Displacement (a.u.) = 6.5*

DOPED TITANIUM NITRIDE MATERIALS FOR DRAM CAPACITORS, AND RELATED SEMICONDUCTOR DEVICES, SYSTEMS, AND METHODS

TECHNICAL FIELD

Embodiments disclosed herein relate to semiconductor fabrication including dynamic random-access memory (DRAM) fabrication. More particularly, embodiments of the disclosure relate to doped titanium nitride (TiN) used in a DRAM capacitor, to methods of forming the DRAM capacitor and to related semiconductor devices and systems.

BACKGROUND

A continuing goal of integrated circuit fabrication is to increase integration density. Dynamic random-access memory (DRAM) utilizes DRAM capacitors to store an amount of electrical charge that represents the logical value of a stored bit. Some DRAM capacitors include container-shaped capacitors having one electrode shaped as a container, with a cell dielectric material and another electrode on the inside of the container only (e.g., a single-sided hole capacitor), or on the outside of the container only (e.g., a single-sided pillar capacitor, or on both the inside and outside of the container (e.g., a double-sided container). To increase integration density, the lateral footprint of the DRAM capacitors has been reduced by increasing the aspect ratio (i.e., ratio of height to width or diameter) and decreasing the proximity of adjacent DRAM capacitors to one another. The high aspect ratio and smaller dimensions have led to structurally weak containers that are prone to toppling or breaking. The container-shaped capacitors have a hollow, cylindrical shape anchored at the top and bottom but are capable of lateral movement, which causes deformation of (e.g., damage to) the DRAM capacitor. Therefore, the structural stability and mechanical strength of the container (e.g., the bottom electrode) is significant to the operability of the DRAM capacitor in the DRAM device.

Titanium nitride (TiN) has been used as an electrode material in DRAM capacitors due to its good step coverage and interfacial properties with the cell dielectric material of the DRAM device. The TiN also exhibits good mechanical, chemical inertness, and electrical resistance (e.g., low resistance) properties. With the decreasing size of the DRAM capacitors, TiN bottom electrodes of the DRAM capacitors have decreased in thickness. However, the reduced thickness of the TiN bottom electrode impacts the surface area of the DRAM capacitors and increases the susceptibility of the TiN to problems associated with oxidation. As the thickness of the TiN decreases, the resistance (Rs) increases exponentially, limiting the use of TiN as an electrode material in smaller DRAM capacitors. The TiN bottom electrodes also provide support and mechanical strength during the fabrication of the DRAM capacitors. With the decreasing size of the DRAM capacitors, retaining structures (e.g., lattice structures) have been used to strengthen the TiN bottom electrode, by supporting exterior sidewalls of the containers defined by the TiN bottom electrodes. However, using the retaining structures increases the complexity of the DRAM capacitor fabrication process.

An additional problem associated with the use of TiN as the bottom electrode is dielectric induced bottom electrode bending (DIBB). As the dimensions of the DRAM capacitors decrease, DIBB increases. DIBB is caused by tensile external forces exerted on the TiN during crystallization of the cell dielectric material of the DRAM capacitor. DIBB is also caused by compressive stresses induced in the DRAM capacitor during oxidative processes conducted during the DRAM capacitor fabrication process, such as pre-treatment processes, dielectric deposition processes, and post-treatment processes.

Silicon-doped TiN has been used as an oxygen diffusion barrier material in a single-sided DRAM capacitor that includes polysilicon or hemispherical polysilicon as the material of the bottom electrode and tantalum oxide as the cell dielectric material. The silicon-doped titanium nitride provided oxidation protection to the polysilicon bottom electrode during rapid thermal annealing of the tantalum oxide cell dielectric material. Incorporating silicon into the titanium nitride was determined to remove the columnar structure of the TiN and undesirably increase the resistivity of the TiN.

Boron-doped TiN has been used as a bottom electrode material in a single-sided metal-insulator-metal capacitor that includes aluminum oxide as the cell dielectric material. The boron-doped TiN is formed over a hemispherical polysilicon material.

DETAILED DESCRIPTION

Figure 1:
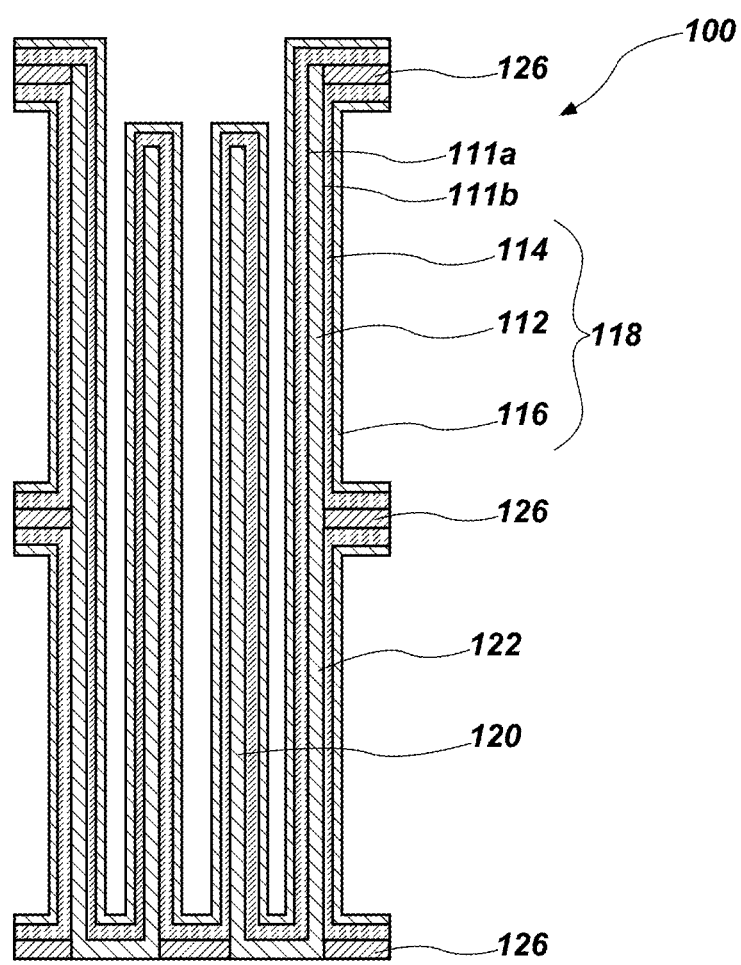
FIG. 1 is a schematic, cross-sectional view of a double-sided DRAM capacitor in accordance with some embodiments of the disclosure.

Doped titanium nitride (TiN) is used as an electrode material of a DRAM capacitor. The doped TiN provides reduced DIBB and increased strength and oxidation resistance to the DRAM capacitor compared to using undoped TiN as the electrode material. The doped TiN is configured to withstand stresses induced during subsequent processing that is utilized to form a DRAM device containing DRAM capacitors. The DRAM capacitor includes a first capacitor electrode (e.g., a bottom electrode) formed from the doped TiN material, a capacitor dielectric, and a second capacitor electrode (e.g., a top electrode), with the capacitor dielectric positioned between the first and second capacitor electrodes. The first capacitor electrode, the capacitor dielectric, and the second capacitor electrode are collectively referred to herein as "capacitor elements." Depending on desired cell capacitance and leakage properties of the DRAM capacitor, the first capacitor electrode may include a single doped TiN material or a stack of materials (e.g., multiple materials) including the doped TiN material. A DRAM device including the DRAM capacitor is also disclosed, as are methods of forming the DRAM capacitor and systems incorporating DRAM memory.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure or a complete process flow for manufacturing semiconductor devices and the structures described below do not form a complete semiconductor device. Only those process acts and structures necessary to understand the embodiments described herein are described in detail below. Additional acts to form a complete semiconductor device may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, the term "about" in reference to a given parameter, property, or condition means and includes to a degree that one of ordinary skill in the art would understand that the given parameter, property, or condition is met with a degree of variance, such as within acceptable manufacturing tolerances.

As used herein, the term "aspect ratio" means and includes a ratio of a height (e.g., length) of a structure such as a DRAM capacitor to a width (e.g., diameter) of the structure. The aspect ratio of the DRAM capacitor may be greater than about 20:1, greater than about 30:1, greater than about 40:1, greater than about 50:1, greater than about 60:1, greater than about 70:1, greater than about 80:1, greater than about 90:1, or greater than about 100:1. In some embodiments, the DRAM capacitor has an aspect ratio of greater than about 50:1. In other embodiments, the DRAM capacitor has an aspect ratio of greater than about 80:1. In yet other embodiments, the DRAM capacitor has an aspect ratio of greater than about 90:1. In yet still other embodiments, the DRAM capacitor has an aspect ratio of greater than about 100:1.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "doped titanium nitride" means and includes a titanium nitride material including titanium, nitrogen, and at least one additional element as a dopant. The doped titanium nitride includes stoichiometric and nonstoichiometric compounds of titanium, nitrogen, and the at least one additional element. In comparison, the term "undoped titanium nitride" is used to refer to stoichiometric and nonstoichiometric compounds of titanium and nitrogen but lacking the additional element (e.g., the dopant).

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "semiconductor device" includes without limitation memory devices, as well as other semiconductor devices which may incorporate memory in addition to other functions such as, for example, a so-called "system on a chip" (SoC) including a processor and memory, or a semiconductor device including logic and memory.

Figure 2:
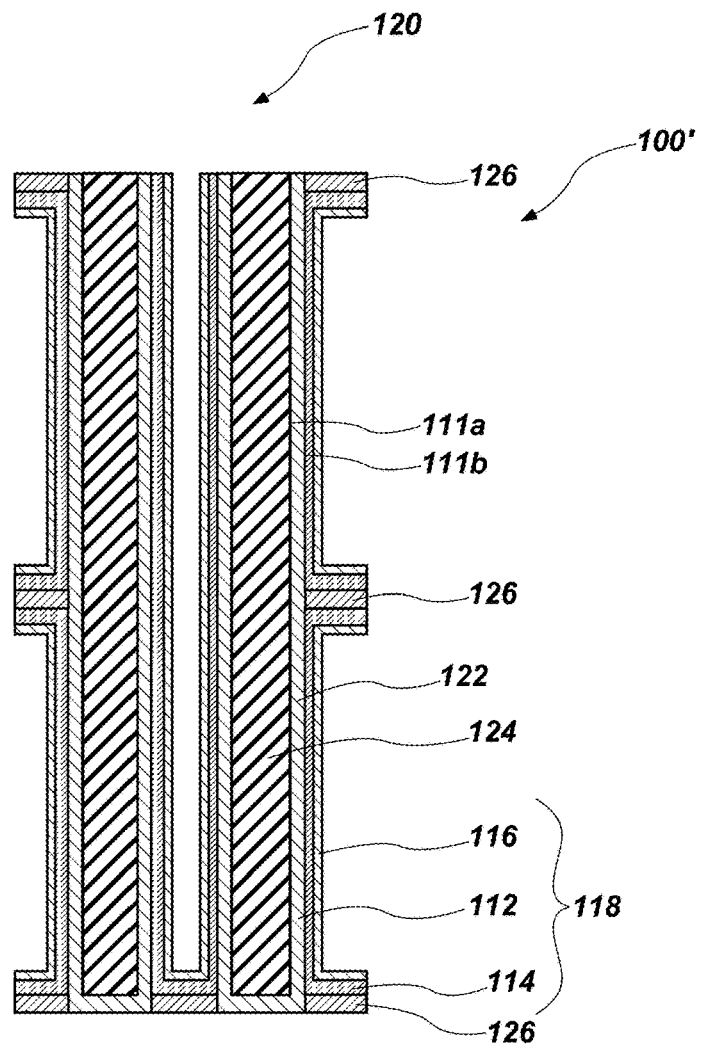
FIG. 2 is a schematic, cross-sectional view of a single-sided (e.g., pillar) DRAM capacitor in accordance with some embodiments of the disclosure.

As shown in FIGS. 1 and 2, a DRAM capacitor 100, 100' includes a first capacitor electrode 112 (e.g., a bottom electrode) on a substrate (not shown). The first capacitor electrode 112 is formed from the doped TiN material. A capacitor dielectric 114 is formed on the first capacitor electrode 112 and a second capacitor electrode 116 (e.g., a top electrode) is formed on the second capacitor electrode 116, with the capacitor dielectric 114 between the first and second capacitor electrodes 112, 116. The first capacitor electrode 112, the capacitor dielectric 114, and the second capacitor electrode 116 are collectively referred to herein as "capacitor elements 118." The DRAM capacitor 100, 100' may be a container capacitor, with the first capacitor electrode 112 defining a container 120. The first capacitor electrode 112 defines a U-shape of the container 120, with vertical portions 122 of the container 120 having substantially uniform lengths (FIG. 2) or different lengths (FIG. 1). The DRAM capacitor 100 may be a double-sided DRAM capacitor 100, as shown in FIG. 1, or a single-sided (e.g., pillar) DRAM capacitor 100', as shown in FIG. 2. In some embodiments, a portion of the capacitor dielectric 114 and the second capacitor electrode 116 is within the container 120, and a portion of the capacitor dielectric 114 and second capacitor electrode 116 is external to (e.g., outside) the container 120. The capacitor dielectric 114 and the second capacitor electrode 116 are formed on both sides of the first capacitor electrode 112. In other embodiments, the capacitor dielectric 114 and second capacitor electrode 116 are located external to the container 120, such as between adjacent containers 120, with a fill material 124 within the container 120, as shown in FIG. 2. The DRAM capacitor 100, 100' may optionally include one or more lattice structures 126 to provide additional support to the container 120. While FIGS. 1 and 2 illustrate three lattice structures 126, the DRAM capacitor 100, 100' may include more lattice structures 126 or fewer lattice structures 126.

The DRAM capacitor 100, 100' may be the double-sided DRAM capacitor 100 of FIG. 1, or the single-sided (e.g., pillar) DRAM capacitor 100' of FIG. 2. In embodiments of the double-sided DRAM capacitor 100, a portion of the capacitor dielectric 114 and the second capacitor electrode 116 is within the container 120, and a portion of the capacitor dielectric 114 and second capacitor electrode 116 is external to the container 120. Thus, both surfaces (e.g., the interior surface 111a and the exterior surface 111b) of the double-sided DRAM capacitor 100 are utilized for capacitance surface area. In embodiments of the single-sided (e.g., pillar) DRAM capacitor 100', the capacitor dielectric 114 and second capacitor electrode 116 are external to the container 120, with the fill material 124 within the container. The fill material 124 may be a conductive material, such as titanium nitride or doped titanium nitride, or may be an insulating material such as silicon nitride, doped silicon nitride, a high-k dielectric material, or an air gap. The capacitor dielectric 114 and second capacitor electrode 116 may be positioned on exterior surfaces 111b of the container 120, such as between adjacent containers 120.

The DRAM capacitor 100, 100' may be a high aspect ratio CHAR) capacitor having an aspect ratio of greater than about 20:1, greater than about 30:1, greater than about 40:1, greater than about 50:1, greater than about 60:1, greater than about 70:1, greater than about 80:1, greater than about 90:1, or greater than about 100:1 For example, the aspect ratio of the DRAM capacitor 100, 100' may be from about 20:1 to about 100:1, such as from about 20:1 to about 30:1, from about 50:1 to about 100:1, or from about 80:1 to about 100:1. In some embodiments, the aspect ratio of the DRAM capacitor 100, 100' is about 100:1. To achieve the high aspect ratio, a diameter (or width) and a height of the DRAM capacitor 100, 100' may be appropriately sized. By way of example only, the diameter (or width) of the DRAM capacitor 100, 100' may be less than or equal to about 650 Å, such as less than or equal to about 400 Å, less than or equal to about 350 Å, less than or equal to about 200 Å, or less than or equal to about 100 Å. The height of the DRAM capacitor 100, 100' may be greater than or equal to about $0.5 \times 10^4$ Å, such as greater than or equal to about $1.0 \times 10^4$ Å, greater than or equal to about $0.5 \times 10^4$ Å, or greater than or equal to about $2.0 \times 10^4$ Å.

The first capacitor electrode 112 of the DRAM capacitor 100, 100' includes the doped TiN, which includes a metalloid element, a metal element, carbon, or combinations thereof as the dopant. By way of example only, the dopant may be silicon, boron, aluminum, zirconium, hafnium, phosphorus, carbon, gallium, germanium, antimony, tellurium, arsenic, tungsten, or combinations thereof. The dopant may be selected based on resistivity or work function properties of the element. The doped TiN may include, but is not limited to, TiSiN, TiBN, TiAlN, TiCN, TiGeN, TiAsN, TiWN, TiGaN, TiZrN, TiHfN, or TiN having two or more of the dopants. In some embodiments, the doped TiN is TiSiN. In other embodiments, the doped TiN is TiBN. The dopant may be present in the doped TiN at from about 0.1 atomic % (at. %) to about 25 at. %, such as from about 0.1 at. % to about 15 at. %, from about 0.1 at. % to about 10 at. %, or from about 1 at. % to about 5 at. %.

The first capacitor electrode 112 may exhibit a thickness of less than or equal to about 110 Å (about 11 nm), such as less than or equal to about 100 Å (about 10 nm), less than or equal to about 80 Å (about 8 nm), less than or equal to about 50 Å (about 5 nm), or less than or equal to about 40 Å (about 4 nm). The first capacitor electrode 112 may be formed at a thickness of between about 20 Å (about 2 nm) and about 100 Å (about 10 nm), such as between about 30 Å (about 3 nm) and about 80 Å (about 8 nm) or between about 40 Å (about 4 nm) and about 75 Å (about 7.5 nm). By way of example only, the first capacitor electrode 112 of the double-sided DRAM capacitor 100 may be from about 30 Å (about 3 nm) to about 80 Å (about 8 nm) in thickness and the first capacitor electrode 112 of the single-sided DRAM capacitor 100' may be from about 30 Å (about 3 nm) to about 80 Å (about 8 nm) in thickness. In some embodiments, the thickness of the first capacitor electrode 112 is about 50 Å (about 5 nm) or about 55 Å (about 5.5 nm). The thickness of the first capacitor electrode 112 is within one of the ranges above regardless of whether the first capacitor electrode 112 includes a single material or multiple materials. However, the first capacitor electrode 112 including the multiple materials (e.g., the stack of materials) may have a greater thickness than the first capacitor electrode 112 including a single material (e.g., the single doped TiN), such as between about 80 Å (about 8 nm) and about 110 Å (about 11 nm).

The doped TiN may be formed by any technique suitable for forming the first capacitor electrode 112 at the desired thickness and at a high degree of conformality (e.g., step coverage). By way of example only, the doped TiN may be formed by atomic layer deposition (ALD) or chemical vapor deposition (CVD). The doped TiN may be formed at a step coverage of greater than about 80%, greater than about 85%, greater than about 90%, or greater than about 95%. In some embodiments, the doped TiN is formed at a step coverage of greater than about 95%. ALD and CVD techniques for forming doped TiN are known in the art and are, therefore, not described in detail herein. Suitable ALD reactants or CVD reactants for the doped TiN may be selected by one of ordinary skill in the art. Titanium reactants may include, but are not limited to, tetrakis(dimethylamido)titanium (TDMAT), tetrakis(ethylmethylamido)titanium (TEMAT), tetrakis(diethylamido)titanium (TDEAT), titanium tetrachloride ($TiCl_4$), or combinations thereof. Nitrogen reactants may include, but are not limited to, $N_2$, $H_2$, $NH_3$, $NH_4^+$, or combinations thereof. Reactants of the dopant include silicon reactants, boron reactants, aluminum reactants, zirconium reactants, hafnium reactants, phosphorus reactants, carbon reactants, gallium reactants, germanium reactants, antimony reactants, tellurium reactants, arsenic reactants, or tungsten reactants. By way of example only, the silicon reactants may include, but are not limited to, silane ($SiH_4$), disilane, dichlorosilane (DCS), tris(dimethylamino)silane (3DMAS), tetrakis(dimethylamino)silane (4DMAS), $H_2Si[N(CH_2H_5)_2]_2$,N,N,N',N'-tetraethyl silane diamine, or combinations thereof. By way of example only, the boron reactants may include, but are not limited to, diborane ($B_2H_6$), boron tribromide ($BBr_3$), boron trichloride ($BCl_3$), iris(ethylmethyl-amino)borane (TEMAB), or combinations thereof. The doped TiN may be formed at a temperature of from about 200° C. to about 600° C., such as from about 200° C. to about 500° C., from about 200° C. to about 400° C., or from about 200° C. to about 350° C. In some embodiments, the doped TiN is TiSiN and is formed by ALD using $TiCl_4$, $SiH_4$, and $NH_3$. In other embodiments, the doped TiN is TiSiN and is formed by ALD using TDMAT, 3DMAS, and $N_2$. In yet other embodiments, the doped TiN is TiSiN and is formed by ALD using $TiCl_4$, DCS, and $NH_3$.

The dopant content in the doped TiN may be tailored by adjusting the number of cycles conducted of TiN deposition relative to the number of cycles conducted of a nitride of the dopant during the ALD or CVD deposition. The relative number of cycles is referred to herein as the titanium nitride:dopant nitride (e.g., TiN:SiN) cycle ratio. By way of example only, the silicon content in TiSiN may be tailored by adjusting the number of cycles of TiN deposition relative to the number of cycles of SiN deposition during the ALD or CVD deposition. By increasing the number of cycles of the dopant nitride deposition relative to the number of cycles of the TiN deposition, the dopant content in the doped TiN may be increased. Similarly, by decreasing the number of cycles of the dopant nitride deposition relative to the number of cycles of the TiN deposition, the dopant content in the doped TiN may be decreased. By way of example only, conducting a 10:1 TiN:SiN cycle ratio produces TiSiN having a higher silicon content than that achieved using a 40:1 TiN:SiN cycle ratio.

Figure 3A:
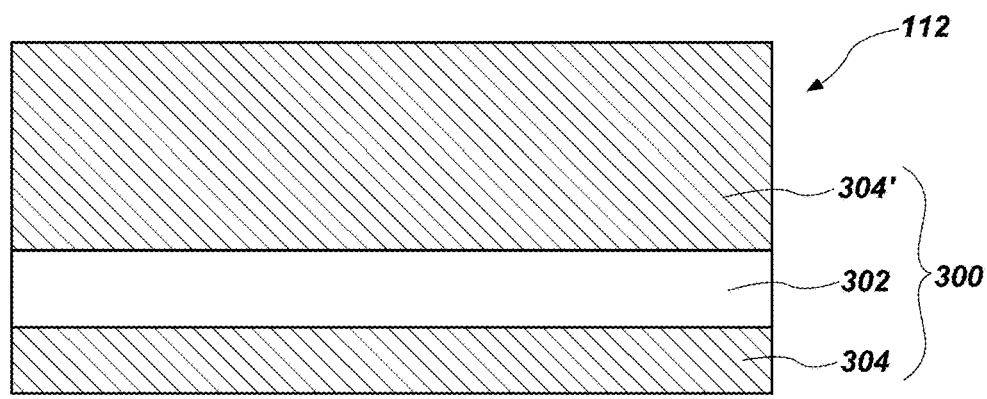
FIGS. 3A-3C are schematic, cross-sectional views of a first capacitor electrode comprising a stack of materials in accordance with some embodiments of the disclosure.
Figure 3B:
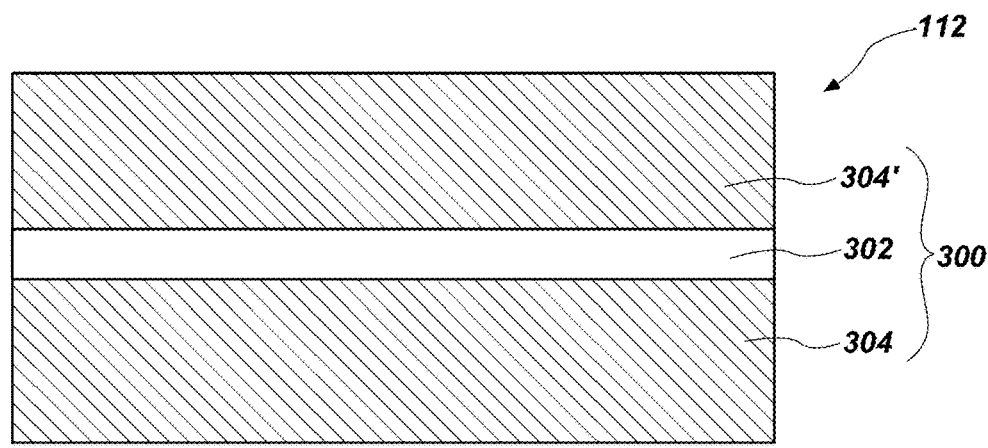
Figure 3C:
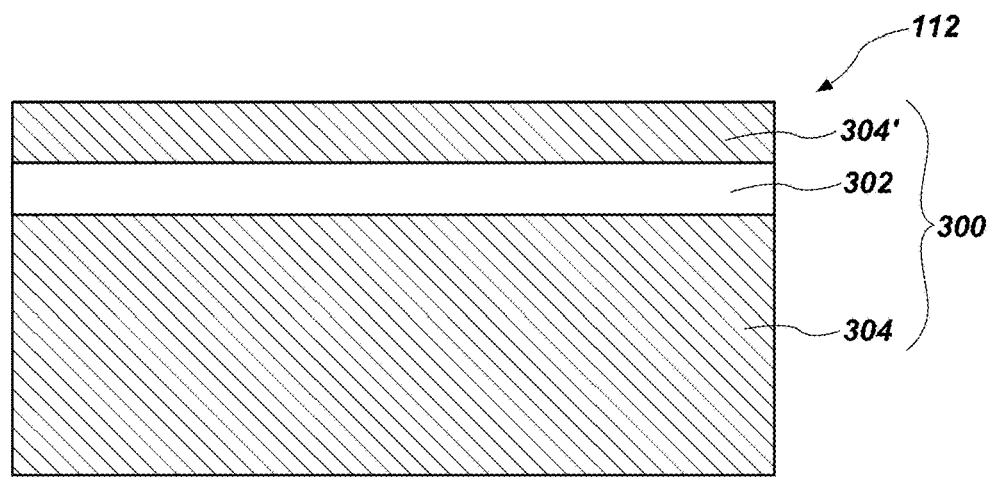

The first capacitor electrode 112 may include the single doped TiN material or may include the multiple materials (e.g., the stack of materials). If the first capacitor electrode 112 contains the single material (e.g., the doped TiN), the doped TiN may be substantially homogeneous in composition, with the dopant distributed substantially uniformly throughout the first capacitor electrode 112. The doped TiN may, alternatively, be heterogeneous in composition (e.g., including a gradient of the dopant). If the first capacitor electrode 112 includes the multiple materials (e.g., a stack 300 of materials that includes the doped TiN), doped TiN 302 may be present in varying positions in the first capacitor electrode 112, as shown in FIGS. 3A, 3B, and 3C. The doped TiN in the stack 300 may be heterogeneous in composition (e.g., including a gradient of the dopant) or homogeneous in composition. The doped TiN 302 may include the dopant at from about 0.1 at. % to about 25 at. %, or may include a 1:1 ratio of titanium nitride:dopant nitride (e.g., TiN:SiN). The position of the doped TiN 302 may depend on desired cell capacitance, gap leakage, and DIBB properties of the DRAM capacitor 100, 100'. The doped TiN 302 may be positioned between two TiN materials 304, 304', with the doped TiN 302 located in a bottom portion of the first capacitor electrode 112 (FIG. 3A), in a middle portion of the first capacitor electrode 112 (FIG. 3B), or in a top portion of the first capacitor electrode 112 (FIG. 3C). The stack 300 of materials may include a desired thickness of the TiN material 304 as a nucleation material, the doped TiN 302 over the nucleation material, and a desired thickness of the TiN material 304' over the doped TiN 302. The thickness of the nucleation material may be sufficient to provide a continuous layer of the TiN material 304 before forming the doped TiN 302 thereover. Each of the TiN materials 304, 304' may undoped TiN or a doped TiN, such as a lightly doped TiN including a 40:1 TiN:SiN cycle ratio. By way of example only, the thickness of the doped TiN 302 may be between about 1 Å and about 75 Å. The first capacitor electrode 112 may, alternatively, include alternating TiN materials 304 and doped TiN 302 (not shown), with TiN as both a lowermost material and an uppermost material of the first capacitor electrode 112. In some embodiments, the doped TiN 302 is located in the top portion of the first capacitor electrode 112. In other embodiments, the doped TiN 302 is located in the middle portion of the first capacitor electrode 112. In yet other embodiments, the doped TiN 302 is located in the bottom portion of the first capacitor electrode 112. By way of example only, the stack 300 may be formed by forming the TiN material 304 by ALD until a desired thickness is achieved, forming the doped TiN 302 by including the dopant reactant in one or more of the ALD cycles until a desired thickness of the doped TiN 302 is achieved, and forming the TiN material 304' over the doped TiN 302 by removing the dopant reactant from subsequent ALD cycles.

The doped TiN of the first capacitor electrode 112 provides increased stability to the DRAM capacitor 100, 100' by reducing or eliminating lateral movement during subsequent process acts. The doped TiN reduces toppling, collapse, wobbling, or bending of the containers 120 during the formation of the DRAM device including the DRAM capacitors. The increased stiffness and rigidity of the first capacitor electrode 112 reduces or eliminates contact between adjacent DRAM capacitors 100, 100' during the subsequent processing. Therefore, shorting between adjacent DRAM capacitors 100, 100' is reduced and damage to the DRAM device is reduced. By using the doped TiN, the first capacitor electrode 112 may be configured to be partially or fully free-standing (e.g., additional support materials do not completely surround the first capacitor electrode 112), eliminating the requirement for one or more lattice structures 126 in the DRAM capacitor 100, 100'. The first capacitor electrode 112 may be sufficiently stiff and rigid without using lattice structures 126 to support the first capacitor electrode 112. Therefore, the DRAM capacitor 100, 100' may be fabricated by a less complex process.

If, however, additional support is desired, one or more optional lattice structures 126 may be present in the DRAM capacitor 100, 100'. The lattice structure 126, if present, may anchor the first capacitor electrode 112 in a desired vertical orientation. By using the doped TiN, the number of lattice structures 126 in the DRAM capacitor 100, 100' may be reduced, such as by utilizing two lattice structures 126 along the height of the DRAM capacitor 100, 100' where three lattice structures 126 would previously have been used to provide the desired support or utilizing one lattice structure 126 along the height of the DRAM capacitor 100, 100' where two lattice structures 126 would previously have been used. As shown in FIGS. 1 and 2, three lattice structures 126 may be present. However, fewer lattice structures 126, such as one lattice structure 126 or two lattice structures 126 may be present. The lattice structures 126 are oriented perpendicular to the first capacitor electrode 112 and directly contact one or more portions of the first capacitor electrode 112. The lattice structures 126 may also be in direct contact with the capacitor dielectric 114.

The increased stability provided by the doped TiN also enables the first capacitor electrode 112 to be scaled physically thinner, which provides increased space within the container 120 for the capacitor dielectric 114 and the second capacitor electrode 116 to be formed. The increased space reduces problems associated with pinching of the capacitor dielectric 114 or the second capacitor electrode 116. The increased stability provided by the doped TiN also enables the first capacitor electrode 112 to withstand stresses induced during subsequent processing of the DRAM capacitor.

Without being bound by any theory, it is believed that the decrease in DIBB observed using the doped TiN of the first capacitor electrode 112 is caused by reduced oxidation associated with deposition and crystallization of the capacitor dielectric 114 and by decreased compressive forces induced in the first capacitor electrode 112 during oxidative processes, such as pre-dielectric treatments or post-dielectric treatments. In comparison, undoped TiN expands when exposed to the oxidative processes, leading to induced stresses and bending in the undoped TiN. The dopant in the doped TiN may affect the crystallinity of the doped TiN, reducing the degree of crystallinity relative to that observed with the undoped TiN. The doped TiN may also exhibit increased resistance to oxidation compared to undoped TiN. Incorporation of the dopant into the TiN may function as an oxygen barrier, increasing the oxidation resistance of the doped TiN.

The capacitor dielectric 114 may be formed of an electrically insulative material including, but not limited to, an electrically insulative oxide or an electrically insulative nitride. By way of example only, the capacitor dielectric 114 may comprise, consist essentially of, or consist of hafnium oxide, silicon dioxide, silicon nitride, zirconium oxide, or combinations thereof. In some embodiments, the capacitor dielectric 114 is zirconium oxide. The capacitor dielectric 114 may be formed by conventional techniques, such as by a physical vapor deposition ("PVD") technique, a CVD technique, or an ALD technique. PVD includes, but is not limited to, sputtering, evaporation, or ionized PVD. Such deposition techniques are known in the art and, therefore, are not described in detail herein.

The second capacitor electrode 116 may be formed of a conductive material including, but not limited to, a metal (e.g., platinum, titanium, tungsten, ruthenium, etc.), a metal-containing composition (e.g., a metal nitride, a metal silicide, etc.), or a conductively doped semiconductor material (e.g., conductively doped silicon, conductively doped germanium, etc.). The second capacitor electrode 116 may be formed by conventional techniques, such as by a PVD technique, a CVD technique, or an ALD technique. The second capacitor electrode 116 may also be referred to herein as a capacitor plate.

The optional lattice structure 126 may be configured to provide additional structural support to the capacitor elements 118, preventing or reducing toppling, collapse, and wobbling of the capacitor elements 118. The lattice structure 126 may be in direct contact with the first capacitor electrode 112 and the capacitor dielectric 114, reducing lateral movement of the container 120 defined by the first capacitor electrode 112. The lattice structure 126 may be formed of an electrically insulative material, such as silicon nitride or a silicon oxide. The lattice structure 126 may have any desired thickness, such as a thickness of from about 50 Å to about 3000 Å, or from about 50 Å to about 1000 Å. One or more of the lattice structures 126 may be present along the height of the first capacitor electrode 112, such as at at least one of a top portion of the first capacitor electrode 112, a middle portion of the first capacitor electrode 112, or a bottom portion of the first capacitor electrode 112. By way of example only, the lattice structure 126 may be present at the top portion and middle portion of the first capacitor electrode 112. Alternatively, the lattice structure 126 may be present at the top portion, the middle portion, and the bottom portion of the first capacitor electrode 112, as shown in FIGS. 1 and 2. The number of lattice structures 126 may depend on the height of the capacitor elements 118 and the mechanical support provided by the first capacitor electrode 112, as long as lateral movement of the capacitor elements 118 is suitably reduced or prevented.

The DRAM capacitor 100, 100' including the first capacitor electrode 112, the second capacitor electrode 116, the capacitor dielectric 114, and any optional lattice structures 126 is formed by conventional techniques. The first capacitor electrode 112 (e.g., bottom electrode) is formed from the doped TiN according to embodiments of the disclosure.

Accordingly, a DRAM capacitor is disclosed and comprises a first capacitor electrode configured as a container and comprising a doped titanium nitride material, a capacitor dielectric on the first capacitor electrode, and a second capacitor electrode on the capacitor dielectric.

Accordingly, a method of forming a DRAM capacitor is disclosed. The method comprises forming a first capacitor electrode comprising a doped titanium nitride material in a shape of a container, forming a capacitor dielectric on the first capacitor electrode, and forming a second capacitor electrode on the capacitor dielectric.

Figure 4:
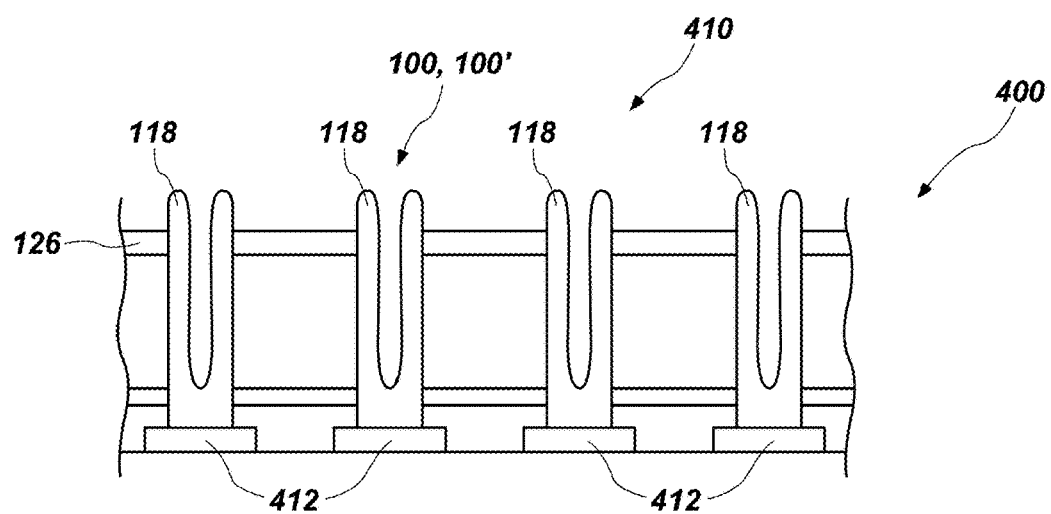
FIG. 4 is a schematic, cross-sectional view of a DRAM device in accordance with some embodiments of the disclosure.

A memory device (e.g., DRAM device 400) including memory cells 410 comprising the DRAM capacitors 100, 100' is shown in FIG. 4. The DRAM device 400 includes a DRAM memory array that includes the memory cells 410 comprising the DRAM capacitors 100, 100' in accordance with some embodiments of the disclosure. The memory cells 410 may be DRAM memory cells that include the DRAM capacitors 100, 100' and access devices 412, such as transistors, operably coupled to the DRAM capacitors 100, 100'. The access device includes a source region, a drain region, and a channel region and enables a read and/or write operation of a charge stored in the DRAM capacitor 100, 100'. The DRAM capacitors 100, 100' are on the substrate (not shown) and include the capacitor elements 118. In FIG. 4, the capacitor elements 118 are illustrated as a single structure for simplicity and convenience. However, the capacitor elements 118 include embodiments of the first capacitor electrode 112 (e.g., the bottom electrode) including the doped TiN material as previously described, the capacitor dielectric 114, and the second capacitor electrode 116 (e.g., the top electrode), with the capacitor dielectric 114 between the first and second capacitor electrodes 112, 116. The DRAM device 400 also optionally includes the lattice structure 126.

Figure 5:
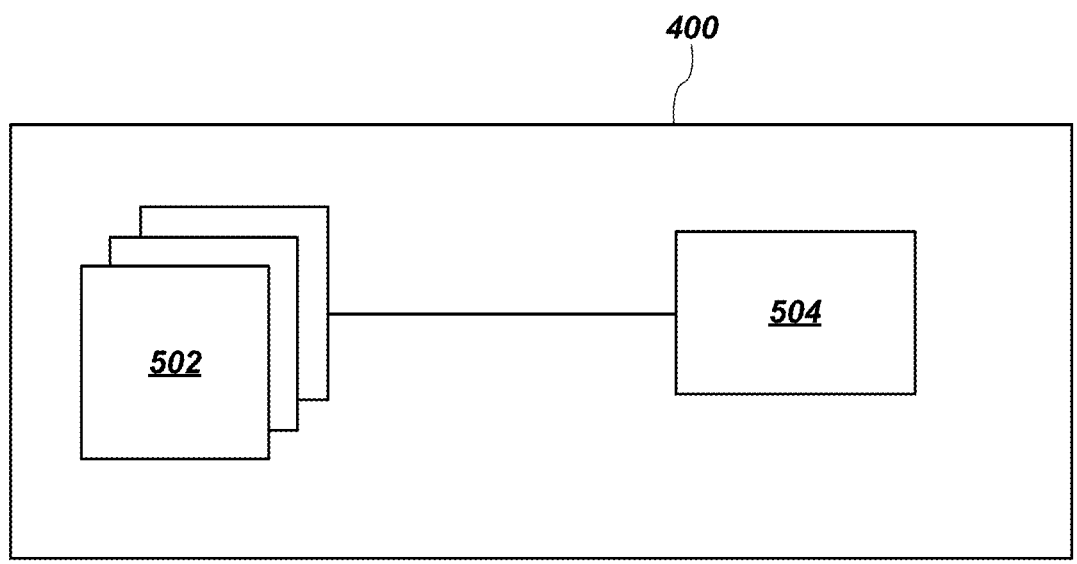
FIG. 5 is a simplified block diagram of a DRAM device including a memory array in accordance with some embodiments of the disclosure.

FIG. 5 is a simplified block diagram of a DRAM device 400 implemented according to one or more embodiments described herein. The DRAM device 400 includes a memory array 502 and a control logic component 504. The memory array 502 may include the memory cells 410 as described above. The control logic component 504 may be operatively coupled with the memory array 502 so as to read, write, or re-fresh any or all memory cells 410 within the memory array 502.

Accordingly, a memory device is disclosed. The memory device comprises DRAM capacitors and access devices operably coupled to the DRAM capacitors. At least one DRAM capacitor of the DRAM capacitors comprises an electrode comprising a doped titanium nitride material, a capacitor dielectric on the electrode, and another electrode on the capacitor dielectric.

Figure 6:
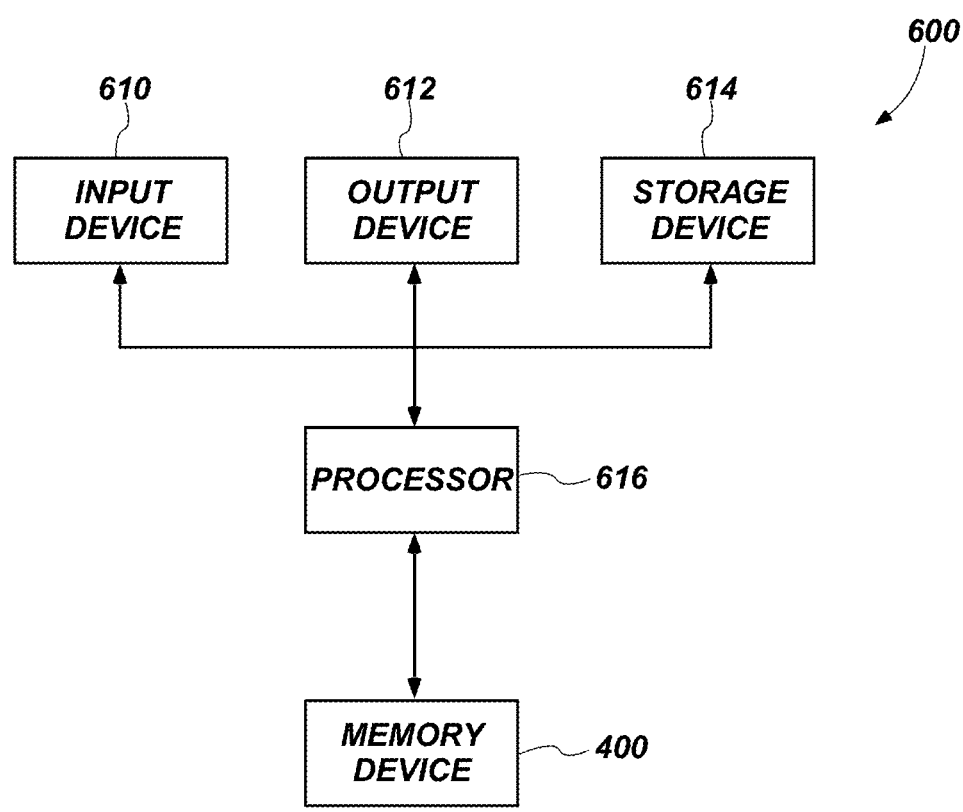
FIG. 6 is a simplified block diagram of a system implemented in accordance with some embodiments of the disclosure.

A system 600 is also disclosed. The system 600 comprises a memory array 502 of memory cells 410, as shown in FIG. 6. Each memory cell 410 includes the access device 412 and the DRAM capacitor 100, 100' operably coupled with the access device 412, with the DRAM capacitor 100, 100' configured as discussed above. FIG. 6 is a simplified block diagram of the system 600 implemented according to one or more embodiments described herein. The system 600 includes at least one input device 610. The input device 610 may be a keyboard, a mouse, or a touch screen. The system 600 further includes at least one output device 612. The output device 612 may be a monitor, touch screen, or speaker. The input device 610 and the output device 612 are not necessarily separable from one another. The system 600 further includes a storage device 614. The input device 610, output device 612, and storage device 614 are coupled to a processor 616. The system 600 further includes the DRAM device 400 coupled to the processor 616, with the DRAM device 400 including at least one memory cell 410. The DRAM device 400 may include an array of memory cells 410. The system 600 may include a computing, processing, industrial, or consumer product. For example, without limitation, the system 600 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

Accordingly, a system is disclosed. The system comprises a memory array comprising memory cells, the memory cells comprising DRAM capacitors and access devices operably coupled to the DRAM capacitors. At least one of the DRAM capacitors comprises a first capacitor electrode comprising a doped titanium nitride material, a capacitor dielectric on the first capacitor electrode, and a second capacitor electrode on the capacitor dielectric.

While embodiments herein describe and illustrate using the doped TiN as an electrode material in a DRAM device 400, the doped TiN may also be used as an electrode material in a replacement gate NAND device.

The following examples serve to explain embodiments of the disclosure in more detail. These examples are not to be construed as being exhaustive or exclusive as to the scope of this disclosure.

Examples

In the examples below, silicon-doped TiN was formed by thermal ALD at a deposition temperature of 540° C. using $TiCl_4$, DCS, and $NH_3$ as the reactants. Undoped TiN was formed by thermal ALD at a deposition temperature of 540° C. using $TiCl_4$ and $NH_3$. Boron-doped TiN was formed by thermal ALD at a deposition temperature of 540° C. using $TiCl_4$, $BCl_3$, and $NH_3$ as the reactants. Undoped TiN was formed by thermal ALD at a deposition temperature of 540° C. using $TiCl_4$ and $NH_3$.

Silicon was incorporated into a 100 Å TiN at 3.2 at. % silicon, 4.4 at. % silicon, and 6.8 at. % silicon. The resistance (Rs) was measured for the 3.2 at. % silicon-doped TiN, 4.4 at. % silicon-doped TiN, and 6.8 at. % silicon-doped TiN and for the undoped TiN. The TiN doped with silicon at between 3 at. % and 5 at. % exhibited between a four times and five times lower resistance than the undoped TiN after oxidative treatment.

Silicon was incorporated into TiN at a 40:1 cycle ratio. The silicon-doped TiN exhibited a 17% higher net growth rate compared to that of the undoped TiN. The increased net growth rate of the silicon-doped TiN may provide significant cost savings compared to that of the undoped TiN.

Figure 7:
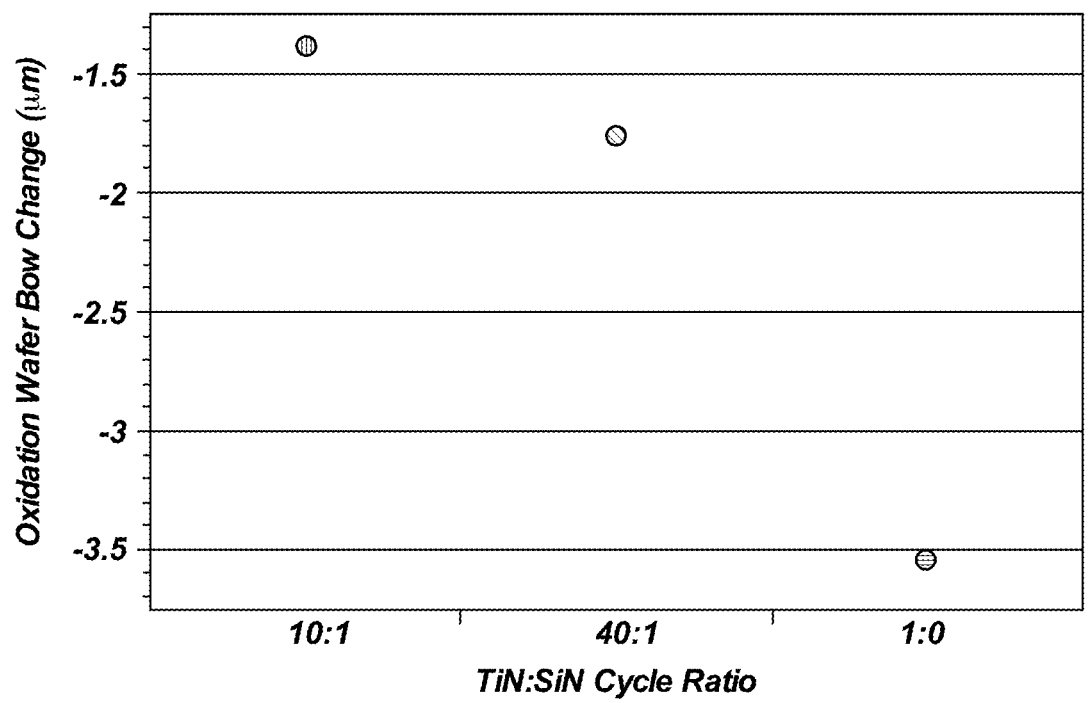
FIG. 7 is a graph of bow change as a function of TiN:SiN cycle ratio for silicon-doped TiN, in accordance with some embodiments of the disclosure, and undoped TiN.

Silicon was incorporated into TiN at a 10:1 (TiN:SiN) cycle ratio and at a 40:1 cycle ratio. The silicon-doped TiN and undoped TiN were formed at varying thicknesses ranging from 43.9 Å to 154.2 Å. Compressive stress in a film of the 10:1 cycle ratio silicon-doped TiN and 40:1 cycle ratio silicon-doped TiN was measured by conventional techniques and compared to that of the undoped TiN. As shown in FIG. 7, when the 10:1 cycle ratio silicon-doped TiN, 40:1 cycle ratio silicon-doped TiN, and undoped TiN were formed at a thickness of about 70 Å, the silicon-doped TiN exhibited reduced compressive stress (as measured by bow change in μm) compared to the undoped TiN.

Figure 8:
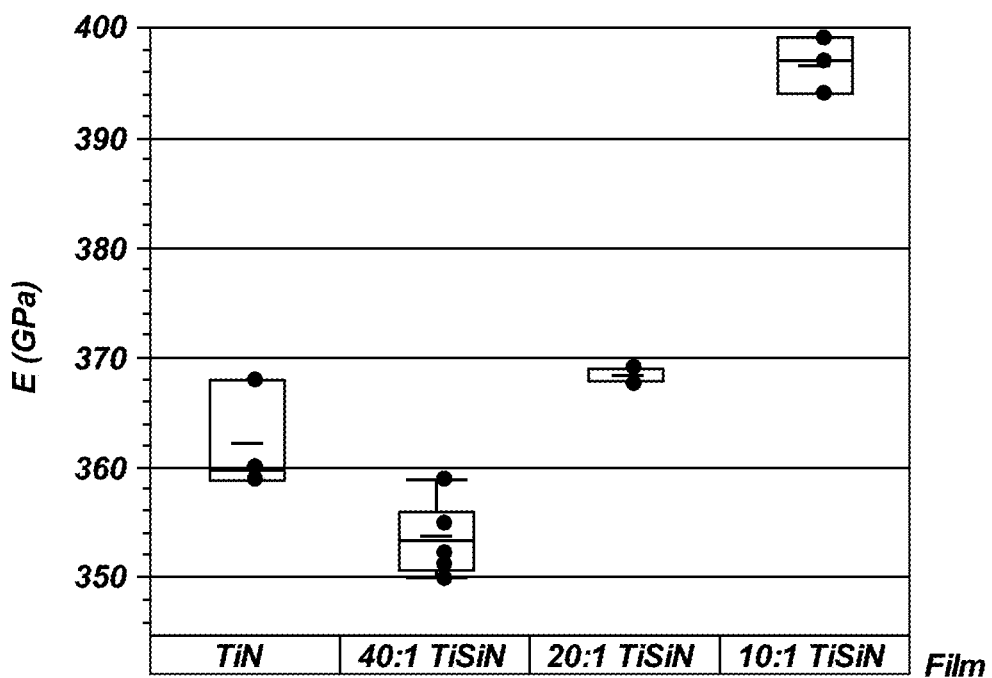
FIG. 8 is a graph of Young's modulus as a function of TiN:SiN cycle ratio for silicon-doped TiN, in accordance with some embodiments of the disclosure, and undoped TiN.

Silicon was incorporated into TiN at a 10:1 (TiN:SiN) cycle ratio, a 20:1 lo cycle ratio, and a 40:1 cycle ratio. The Young's modulus of the silicon-doped TiN was compared to that of the undoped TiN. As shown in FIG. 8, the silicon-doped TiN having increased silicon content exhibited comparable or greater Young's modulus compared to the undoped TiN.

Figure 9A:
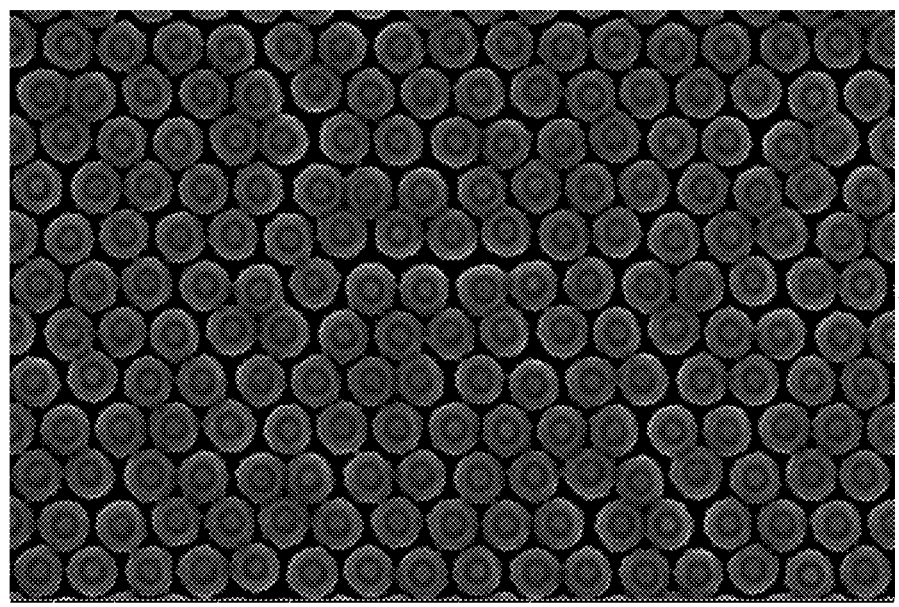
FIGS. 9A and 9B are electron micrographs showing bending of containers formed from silicon-doped TiN, in accordance with some embodiments of the disclosure, and undoped TiN.
Figure 9B:
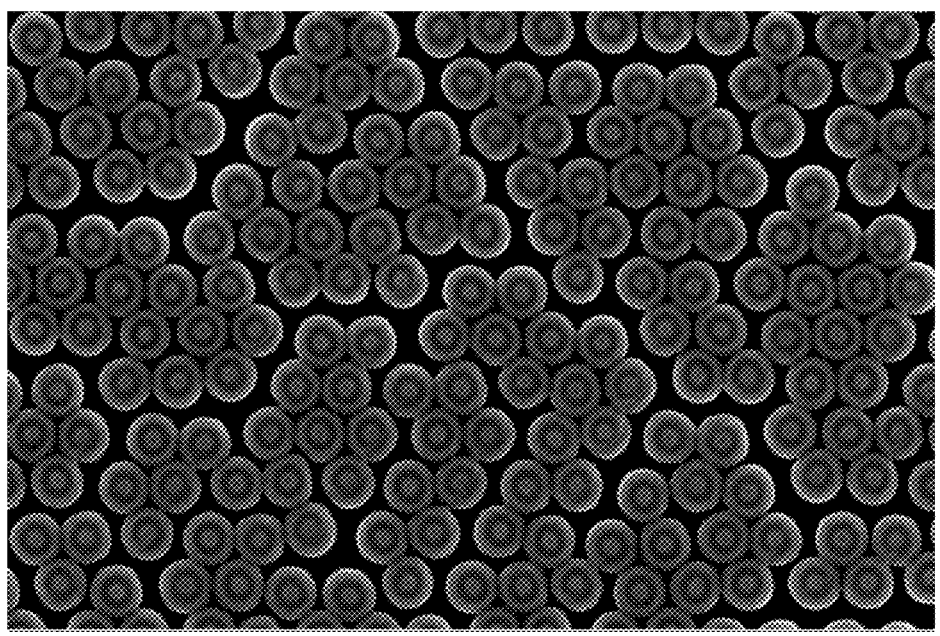

Silicon was incorporated into TiN at a 10:1 (TiN:SiN) cycle ratio and the silicon-doped TiN used to form containers. Bending of the silicon-doped TiN was measured by container displacement between adjacent containers formed from the silicon-doped TiN and compared to that of containers formed from the undoped TiN. As shown in FIGS. 9A and 9B, the containers formed from the silicon-doped TiN (FIG. 9A) exhibited reduced container displacement, as evidenced by reduced clustering, compared to the containers formed of the undoped TiN (FIG. 9B).

Figure 10:
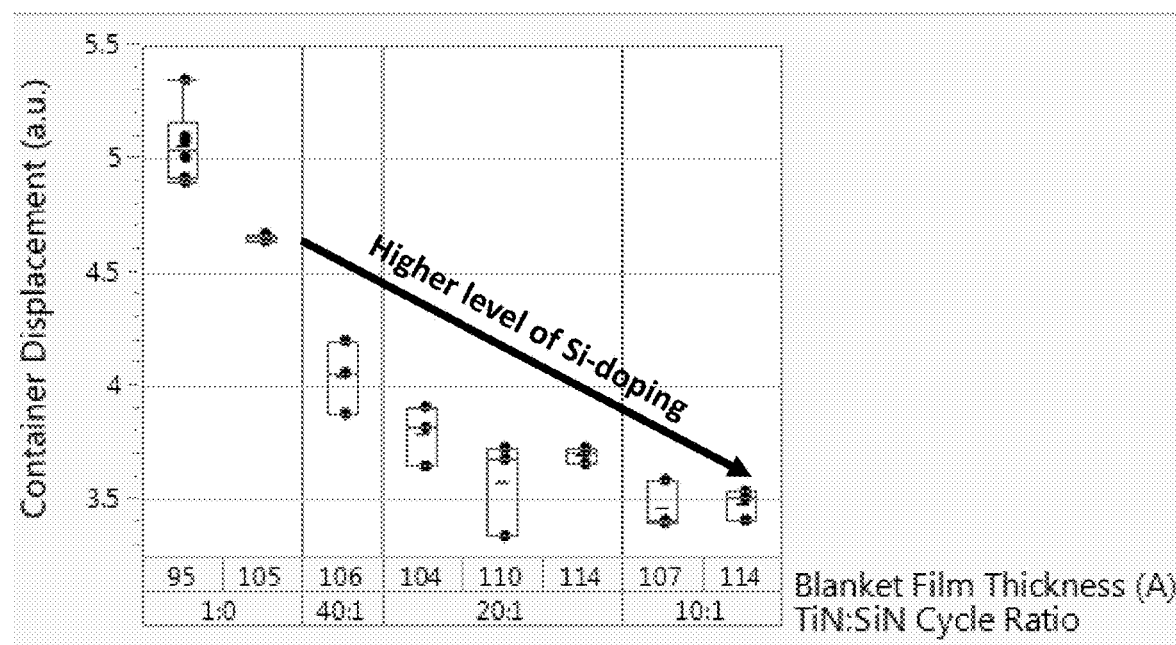
FIG. 10 is a graph of DIBB (container displacement) as a function of test wafer (TW) blanket thickness for silicon-doped TiN, in accordance with some embodiments of the disclosure, and undoped TiN.

Silicon was incorporated into TiN at a 10:1 (TiN:SiN) cycle ratio, a 20:1 cycle ratio, and a 40:1 cycle ratio. The DIBB (as measured in arbitrary units (a.u.) by container displacement) of the silicon-doped TiN was compared to that of the undoped TiN, as shown in FIG. 10. The silicon-doped TiN showed a significant improvement in DIBB compared to the undoped TiN, with additional improvements in the DIBB observed with increasing silicon content.

Figure 11:
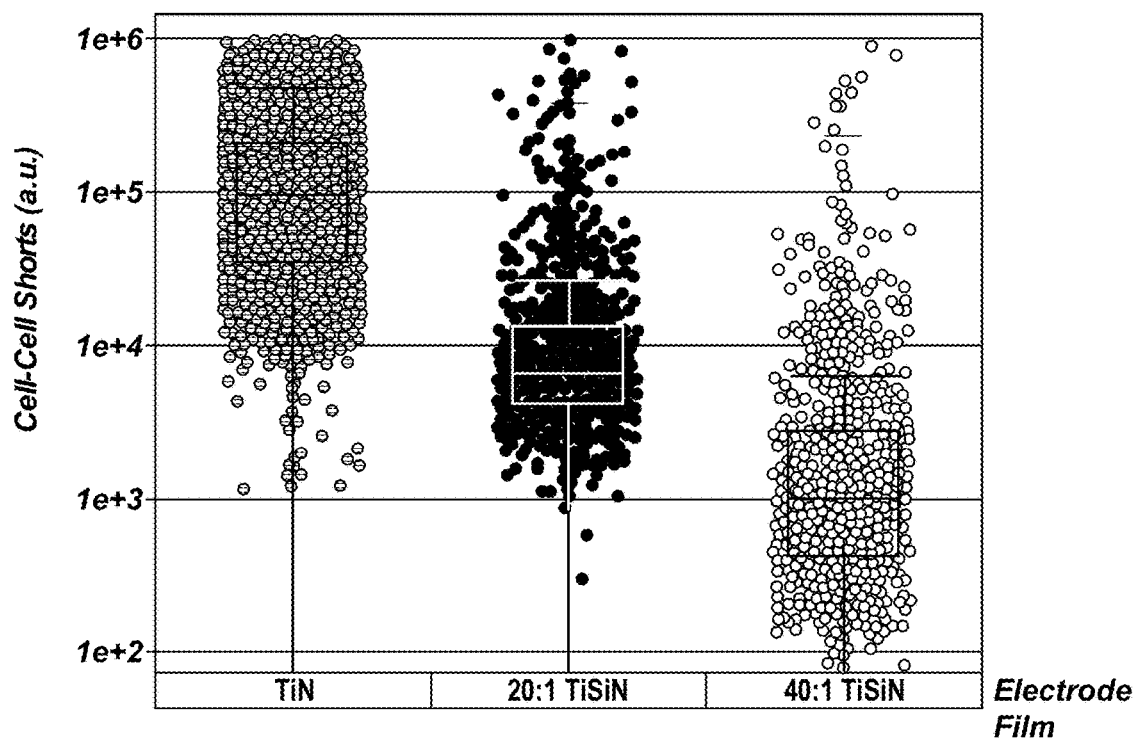
FIG. 11 is a graph showing cell-cell shorts as a function of TiN:SiN cycle ratio for silicon-doped TiN, in accordance with some embodiments of the disclosure, and undoped TiN.

Silicon was incorporated into TiN at a 20:1 (TiN:SiN) cycle ratio and a 40:1 cycle ratio. Cell-cell shorts were measured in arbitrary units (a.u.) by conventional techniques. The silicon-doped TiN showed about a ten times reduction in shorting between adjacent bottom capacitor electrodes formed of the silicon-doped TiN compared to bottom capacitor electrodes formed of the undoped TiN, as shown in FIG. 11.

Figure 12:
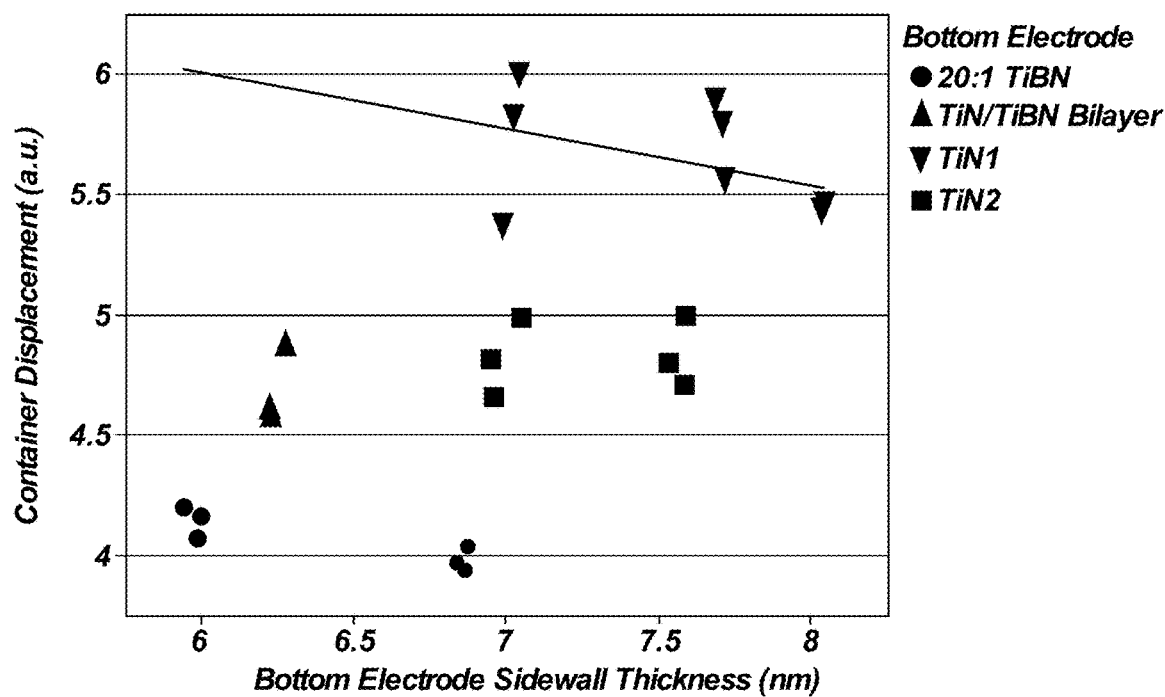
FIG. 12 is a graph of DIBB (container displacement) as a function of average thickness for boron-doped TiN, in accordance with some embodiments of the disclosure, and undoped TiN.

Boron was incorporated into TiN at a 20:1 (TiN:BN) cycle ratio and a 10:1 cycle ratio. The DIBB (as measured in arbitrary units (a.u.) by container displacement) of the boron-doped TiN was compared to that of the undoped TiN. As shown in FIG. 12, the boron-doped TiN exhibited lower DIBB (e.g., lower container displacement) than the undoped TiN.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A DRAM capacitor, comprising:
a first capacitor electrode configured as a container and comprising a stack of a doped titanium nitride material and titanium nitride, the doped titanium nitride material selected from the group consisting of titanium germanium nitride, titanium arsenic nitride, titanium tungsten nitride, titanium gallium nitride, titanium zirconium nitride, titanium tellurium nitride, titanium phosphorus nitride, titanium antimony nitride, and combinations thereof;
a capacitor dielectric on an interior surface and on an exterior surface of vertical portions of the first capacitor electrode configured as the container; and
a second capacitor electrode on the capacitor dielectric.

2. The DRAM capacitor of claim 1, wherein the first capacitor electrode comprises a thickness of from about 20 Å to about 100 Å.

3. The DRAM capacitor of claim 1, wherein a thickness of the first capacitor electrode is less than or equal to about 40 Å.

4. The DRAM capacitor of claim 1, wherein the doped titanium nitride material comprises one or more of silicon, zirconium, phosphorus, carbon, gallium, germanium, antimony, tellurium, arsenic, or tungsten at from about 0.1 atomic % to about 15 atomic %.

5. The DRAM capacitor of claim 1, wherein the first capacitor electrode comprises a single, doped titanium nitride material.

6. The DRAM capacitor of claim 1, wherein the stack comprises the doped titanium nitride material between two portions of titanium nitride.

7. The DRAM capacitor of claim 1, wherein the stack comprises the doped titanium nitride material in a top portion thereof.

8. The DRAM capacitor of claim 1, wherein the stack comprises the doped titanium nitride material in a middle portion thereof.

9. The DRAM capacitor of claim 1, wherein the stack comprises the doped titanium nitride material in a bottom portion thereof.

10. The DRAM capacitor of claim 1, wherein the doped titanium nitride material comprises a heterogeneous composition.

11. The DRAM capacitor of claim 1, wherein the doped titanium nitride material comprises a homogeneous composition.

12. The DRAM capacitor of claim 1, further comprising at least one lattice structure laterally adjacent to the first capacitor electrode.

13. The DRAM capacitor of claim 12, wherein the at least one lattice structure is oriented perpendicular to and directly contacts the first capacitor electrode.

14. A method of forming a DRAM capacitor, comprising: forming a first capacitor electrode comprising a stack of materials comprising a doped titanium nitride material and titanium nitride, in a shape of a container, the doped titanium nitride material selected from the group consisting of titanium germanium nitride, titanium arsenic nitride, titanium tungsten nitride, titanium gallium nitride, titanium zirconium nitride, titanium tellurium nitride, titanium phosphorus nitride, titanium antimony nitride, and combinations thereof; forming a capacitor dielectric on an interior surface and on an exterior surface of vertical portions of the first capacitor electrode; and forming a second capacitor electrode on the capacitor dielectric.

15. The method of claim 14, wherein forming a first capacitor electrode in a shape of a container comprises forming the doped titanium nitride material of the container comprising a U-shaped cross-section.

16. A semiconductor device comprising:
DRAM capacitors, at least one DRAM capacitor of the DRAM capacitors comprising:
an electrode comprising a stack, the stack comprising:
a first material comprising titanium nitride;
a second material comprising titanium nitride; and
at least one third material between the first material and the second material, the at least one third material comprising a doped titanium nitride material, a dopant of the doped titanium nitride material comprising a metalloid element, a metal element, or combinations thereof, and the at least one third material comprising a different material composition than the first material and the second material,
wherein the electrode defines a U-shaped container in cross-section;
a capacitor dielectric directly contacting an interior surface and an exterior surface of the U-shaped container; and
another electrode on the capacitor dielectric; and access devices operably coupled to the DRAM capacitors.

17. The semiconductor device of claim 16, wherein the capacitor dielectric is on the interior surface and on the exterior surface of the U-shaped container and the another electrode is on the capacitor dielectric on the interior surface and the exterior surface of the U-shaped container.

18. The semiconductor device of claim 16, wherein an aspect ratio of the at least one DRAM capacitor is greater than about 20:1.

19. The semiconductor device of claim 16, wherein an aspect ratio of the at least one DRAM capacitor is from about 50:1 to about 100:1.

20. The semiconductor device of claim 16, wherein the at least one DRAM capacitor is configured as a double-sided capacitor comprising the capacitor dielectric directly contacting the interior surface and the exterior surface of the U-shaped container.

21. The semiconductor device of claim 16, wherein both the first material and the second material comprise undoped titanium nitride.

22. The semiconductor device of claim 16, further comprising at least one fourth material adjacent to and between the at least one third material and the first material, wherein the at least one fourth material comprises titanium nitride.

23. A system comprising:
a memory array comprising:
memory cells comprising DRAM capacitors and access devices operably coupled to the DRAM capacitors, at least one of the DRAM capacitors comprising:
a first capacitor electrode defining a container and comprising a stack, the stack comprising:
a first material comprising titanium nitride;
a second material comprising titanium nitride; and
at least one third material between the first material and the second material, the at least one third material comprising a doped titanium nitride material, a dopant of the doped titanium nitride material comprising a metalloid element, a metal element, or combinations thereof, and the at least one third material comprising a different material composition than the first material and the second material;
a capacitor dielectric on the first capacitor electrode; and
a second capacitor electrode on the capacitor dielectric,
wherein a portion of the capacitor dielectric and the second capacitor electrode is in the container and the portion of the capacitor dielectric directly contacts the first capacitor electrode and another portion of the capacitor dielectric and the second capacitor electrode is outside the container and directly contacts the first capacitor electrode.

24. A DRAM capacitor, comprising:
a first capacitor electrode configured as a container and comprising a doped titanium nitride material, the doped titanium nitride material comprising two or more dopants, the two or more dopants comprising silicon or boron;
a capacitor dielectric on an exterior surface of the first capacitor electrode configured as the container; and
a second capacitor electrode on the capacitor dielectric, the second capacitor electrode consisting of titanium, a metal silicide, or conductively doped silicon or germanium.

25. The semiconductor device of claim 16, wherein the capacitor dielectric is directly on the exterior surface of the U-shaped container, and the another electrode is directly on the capacitor dielectric.

26. The DRAM capacitor of claim 24, wherein the DRAM capacitor is configured as a pillar capacitor.

* * * * *